(12) United States Patent
Lutz

(10) Patent No.: US 10,606,557 B2
(45) Date of Patent: Mar. 31, 2020

(54) LEADING ZERO ANTICIPATION

(71) Applicant: ARM Limited, Cambridge (GB)

(72) Inventor: David Raymond Lutz, Austin, TX (US)

(73) Assignee: ARM Limited, Cambridge (GB)

(*) Notice: Subject to any disclaimer, the term of this patent is extended or adjusted under 35 U.S.C. 154(b) by 104 days.

(21) Appl. No.: 15/370,212

(22) Filed: Dec. 6, 2016

(65) Prior Publication Data

US 2018/0157463 A1  Jun. 7, 2018

(51) Int. Cl.
| | |
|---|---|
| *G06F 7/483* | (2006.01) |
| *G06F 5/01* | (2006.01) |
| *H03K 19/20* | (2006.01) |
| *G06F 7/74* | (2006.01) |

(52) U.S. Cl.
CPC ............ *G06F 7/483* (2013.01); *G06F 5/012* (2013.01); *G06F 7/74* (2013.01); *H03K 19/20* (2013.01)

(58) Field of Classification Search
CPC ........ G06F 7/74; G06F 7/499; G06F 7/49936; G06F 5/01
USPC .................................................. 708/201, 205
See application file for complete search history.

(56) References Cited

U.S. PATENT DOCUMENTS

| | | | |
|---|---|---|---|
| 5,805,487 A | 9/1998 | Elliott et al. | |
| 5,841,683 A * | 11/1998 | Bechade | G06F 7/483 708/497 |
| 2015/0254066 A1 * | 9/2015 | Lutz | G06F 5/012 708/205 |
| 2015/0378679 A1 | 12/2015 | Dao et al. | |

OTHER PUBLICATIONS

M.G. Atkins and J.R. Herring, Floating Point Adder Leading Zero Anticipate, IBM Technical Disclosure Bulletin, vol. 36 No. 10 1993, p. 545-548 (Year: 1993).*
UK Combined Search and Examination Report dated May 18, 2018 in GB Application No. 1720229.2, 6 pages.
Examination Report dated Jan. 18, 2019 in GB Application No. 1720229.2, 4 pages.

* cited by examiner

*Primary Examiner* — Andrew Caldwell
*Assistant Examiner* — Emily E Larocque
(74) *Attorney, Agent, or Firm* — Nixon & Vanderhye P.C.

(57) ABSTRACT

A data processing apparatus is provided. Intermediate value generation circuitry generates an intermediate value from a first floating point number and a second floating point number. The intermediate value includes a number of leading 0s indicative of a prediction of a number of leading 0s in a difference between absolute values of the first floating point number and the second floating point number. The prediction differs by at most one from the number of leading 0s in the difference between absolute values of the first floating point number and the second floating point number. Count circuitry counts the number of leading 0s in said intermediate value and mask generation circuitry produces one or more masks using the intermediate value. The mask generation circuitry produces the one or more masks at the same time or before the count circuitry counts the number of leading 0s in the intermediate value.

16 Claims, 8 Drawing Sheets

LEADING ZERO ANTICIPATION

TECHNICAL FIELD

The present disclosure relates to data processing. For example, it may relate to floating point numbers.

DESCRIPTION

Floating point numbers can be represented as a combination of a significand multiplied by a base number raised to the power of an exponent. For example, the value 0.0012 could be expressed as the number $1.2 \times 10^{-3}$ with the significand being 1.2, the base being 10, and the exponent being −3. In a binary representation, it is common for the base to be 2. A normalised floating point number has a significand of at least 1 and less than 2. When subtracting one floating point number from another, the result can be a very small number—i.e. there can be a large number of leading zeros. It has previously been proposed to normalise this number by counting a number of leading zeros (either an actual number or a predicted number) in order to generate one or more masks. If this is not done before the difference is calculated (as is often the case when performing fused multiply-add operations) then there can be a resulting stall while the number of leading zeros is calculated in order that the difference can be normalised.

SUMMARY

Viewed from a first example configuration, there is provided a data processing apparatus comprising: intermediate value generation circuitry to generate an intermediate value from a first floating point number and a second floating point number, wherein said intermediate value comprises a number of leading 0s indicative of a prediction of a number of leading 0s in a difference between absolute values of said first floating point number and said second floating point number, said prediction differing by at most one from said number of leading 0s in said difference between absolute values of said first floating point number and said second floating point number; count circuitry to count said number of leading 0s in said intermediate value; and mask generation circuitry to produce one or more masks using said intermediate value, wherein said mask generation circuitry is configured to produce said one or more masks at a same time or before said count circuitry counts said number of leading 0s in said intermediate value.

Viewed from a second example configuration, there is provided a data processing apparatus comprising: intermediate value generation means for generating an intermediate value from a first floating point number and a second floating point number, wherein said intermediate value comprises a number of leading 0s indicative of a prediction of a number of leading 0s in a difference between absolute values of said first floating point number and said second floating point number, said prediction differing by at most one from said number of leading 0s in said difference between absolute values of said first floating point number and said second floating point number; count means for counting said number of leading 0s in said intermediate value; and mask generation means for producing one or more masks using said intermediate value, wherein said mask generation means produces said one or more masks at a same time or before said count means counts said number of leading 0s in said intermediate value.

Viewed from a third example configuration, there is provided a data processing method comprising: generating an intermediate value from a first floating point number and a second floating point number, wherein said intermediate value comprises a number of leading 0s indicative of a prediction of a number of leading 0s in a difference between absolute values of said first floating point number and said second floating point number, said prediction differing by at most one from said number of leading 0s in said difference between absolute values of said first floating point number and said second floating point number; counting said number of leading 0s in said intermediate value; and producing one or more masks using said intermediate value, wherein said step of producing one or more masks occurs at a same time or before said step of counting said number of leading 0s in said intermediate value.

BRIEF DESCRIPTION OF THE DRAWINGS

The present invention will be described further, by way of example only, with reference to embodiments thereof as illustrated in the accompanying drawings, in which.

DESCRIPTION OF EXAMPLE EMBODIMENTS

Figure 1:
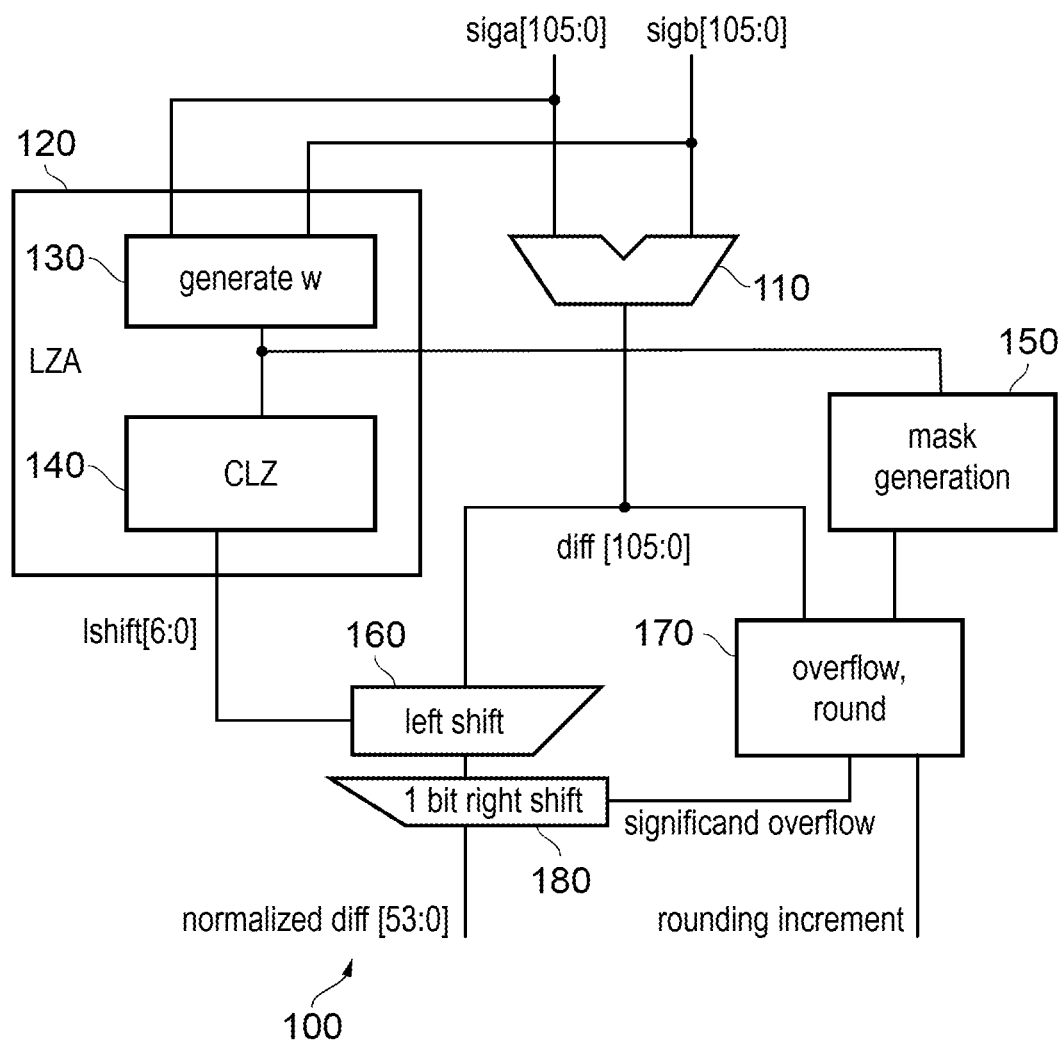
FIG. 1 illustrates an example data processing apparatus in accordance with one embodiment.

Before discussing the embodiments with reference to the accompanying figures, the following description of embodiments is provided.

In accordance with one example configuration there is provided a data processing apparatus comprising: intermediate value generation circuitry to generate an intermediate value from a first floating point number and a second floating point number, wherein said intermediate value comprises a number of leading 0s indicative of a prediction of a number of leading 0s in a difference between absolute values of said first floating point number and said second floating point number, said prediction differing by at most one from said number of leading 0s in said difference between absolute values of said first floating point number and said second floating point number; count circuitry to count said number of leading 0s in said intermediate value; and mask generation circuitry to produce one or more masks using said intermediate value, wherein said mask generation circuitry is configured to produce said one or more masks at a same time or before said count circuitry counts said number of leading 0s in said intermediate value.

Given the first floating point number and the second floating point number, the intermediate value generation circuitry generates an intermediate value. The intermediate value can be used to predict the number of leading zeros in the absolute difference between first (a) and second (b) floating point numbers. It will be appreciated that in binary arithmetic, a difference can be calculated by performing a sum operation and therefore the term "difference" does not necessarily necessitate a subtraction being performed, but rather refers to the difference between the absolute values of two terms, i.e. |||a|−|b|||. The intermediate value can be used to determine a prediction of the number of leading zeros in that the prediction could be off by one. In particular, the prediction might not take into account the possibility of a "carry" occurring at any stage during the absolute difference calculation. In any event, having generated the intermediate value, mask generation circuitry is used to produce one or more masks using this intermediate value. Furthermore, the masks are generated at the same time or before count circuitry counts the number of leading zeros in the intermediate value. The mask is therefore generated more quickly than a method that counts the number of leading zeros in the intermediate value and then uses that information to generate the mask. Consequently, the masks can be available more quickly and so can be available at the same time as the difference between the absolute values of the floating point numbers being calculated. The intermediate value could be an intermediate value of the calculation of the absolute difference between the two floating point numbers, e.g. it could be a value that is used midway through the calculation. For example, the masks could be generated directly from the intermediate value.

In some embodiments, the data processing apparatus comprises difference circuitry to determine a difference of said absolute values of said first floating point number and said second floating point number. Such difference circuitry can be used to determine the actual difference between the absolute values of two floating point numbers. However, the difference might not be normalised, although normalisation could be performed based on the intermediate value.

In some embodiments, said intermediate value comprises a number of leading zeros, followed by a most significant 1, followed by zero or more 0s and 1s; and a position of said most significant 1 is either: a same as a position of a most significant 1 in said difference of said absolute values of said first floating point number and said second floating point number, or adjacent said position of said most significant 1 in said difference of said absolute values of said first floating point number and said second floating point number. In these embodiments, the intermediate value indicates the number of leading zeros in the difference of the absolute values of the two floating point numbers by having a same number of (or one too many) leading zeros as the difference. For example, the difference 000001001 could have intermediate values of 000001101 or 000000101, which have the same number and one more leading zeros respectively.

In some embodiments, said one or more masks comprises an lmask to indicate said position of said most significant 1 in said intermediate value; and said mask generation circuitry produces said lmask by taking said intermediate value and replacing said zero or more 0s and 1s with an equal number of 0s. One of the masks produced by the mask generation circuitry from an intermediate value is an lmask. The lmask is made up from a contiguous number of leading zeros, followed by a contiguous number of leading ones. The number of contiguous leading zeros is either the same or one off the number of leading zeros in the difference between absolute values of the floating point numbers. For example, given a difference of 00110, possible values of the lmask are: 00111 and 00011 when the number of leading zeros is the same, or one more, respectively.

In some embodiments, the data processing apparatus comprises significand overflow detection circuitry to detect, based on said lmask and said difference, whether a significand of said difference has overflowed. There are a number of ways in which it can be determined whether or not the significand has overflowed. However, in some embodiments, said significand overflow detection circuitry is configured to detect whether said significand of said difference has overflowed by performing a logical AND operation between said lmask and bits other than a low-order bit of said difference. For example, by performing a logical AND operation between corresponding pairs of bits, and then performing a reduction OR operation (i.e. by performing an OR operation between all of the bits from the resulting AND operation) an overall result can be determined that indicates whether the significand has overflowed. This has the effect that if one of the logical AND operations between the corresponding pairs of bits is positive (i.e. if the corresponding bit in the lmask and the corresponding bit in the difference are both '1') then a significand overflow has occurred. It will, of course, be appreciated that other logical operations could be performed in order to indicate the presence of a significand overflow differently. For example, by inverting the result of the reduction OR operation, a '0' indicates that a significand overflow has occurred.

In some embodiments, said significand overflow detection circuitry is configured to detect whether said significand of said difference has overflowed by performing a logical pairwise AND operation between said lmask shifted left once and bits other than a low-order bit of said difference. In such embodiments, rather than "wiring" the relevant bits to be compared, a logical left shift operation is performed, which physically shifts the bits one place to the left. As before, a bitwise AND operation can be performed on corresponding bits between the shifted lmask and the difference. In some embodiments, a further reduction OR operation can be performed to get an indicator of whether a significand overflow has occurred. It will be appreciated that other methods of determining overflow also exist. For example, a logical shift to the right could be carried out on the difference before performing the bitwise logical AND operation on the corresponding bits.

In some embodiments, the data processing apparatus comprises bit obtaining circuitry to return, based on said lmask, a value of a given bit of said difference. There are a number of different bits that can be returned by such bit obtaining circuitry. For example, in some embodiments, said given bit is one of: an overflow least significant bit, a least significant bit, an overflow guard bit, and a guard bit. The least significant bit refers to the least significant bit of the significand. The guard bit refers to the next least significant bit (e.g. the most significant bit that is not part of the significand). Each of these bits is used during the process of rounding. The overflow least significant bit, and the overflow guard bit refer to the least significant bit and the guard bit when the significand has overflowed. The overflow of the significand causes these bits to increase in significance by one place.

There are a number of ways that the bit obtaining circuitry can obtain the given bit. However, in some embodiments, said bit obtaining circuitry returns said value of said given bit of said difference by performing a logical AND on said difference and said lmask shifted right a number of times; and said number of times is dependent on said given bit. In some other embodiments, it could be the difference that is shifted left a number of times dependent on the given bit.

In some embodiments, said one or more masks comprises an smask to indicate a position of a bit other than leading 0s in said difference; and said mask generation circuitry produces said smask by taking said intermediate value and replacing said zero or more 0s and is with an equal number of 1s. The smask is a second mask that can be produced by the mask generation circuitry. Whereas the lmask is produced by setting bits after the most significant one to zeros, the smask sets all bits after the most significant one to ones. The number of bits in the smask is equal to the number of bits in the intermediate value.

In some embodiments, the data processing apparatus comprises bit obtaining circuitry to return, based on said smask, zero or more trailing bits of said difference. The smask can thereby be used to return a number of contiguous least significant bits from the difference.

There are a number of ways in which the smask can be used to obtain the trailing bits of the difference. However, in some embodiments, said bit obtaining circuitry returns said zero or more trailing bits of said difference by performing a logical AND operation on a subset of bits of said difference and a subset of bits of said smask. In some embodiments, the subset includes all of the bits of the smask and all of the bits of the difference. In some other embodiments, the subset is a strict subset, and includes only some of the bits of the smask and the difference.

In some embodiments, said trailing bits comprise an overflow sticky bit; said subset of bits of said difference is a trailing x bits of said difference and said subset of bits of said smask is a trailing x bits of said smask; and x is equal to a number of sticky bits in said difference plus one. The trailing x bits of the difference and the trailing x bits of the smask could refer, for example, to the x least significant bits of the difference and the smask. The overflow sticky bit refers to the bit that would become the sticky bit in the event that the significand overflowed (e.g. was shifted left once as a consequence of a carry occurring during the difference calculation of the most significant bits of the significand).

In some embodiments, said trailing bit comprises a sticky bit; said subset of bits of said difference is a trailing y bits of said difference and said subset of bits of said smask is a trailing y bits of said smask; and y is equal to a number of sticky bits in said difference.

In some embodiments, said first floating point number and said second floating point number are normalised. For example, the first floating point number and the second floating point number are normalised before the count circuitry counts the number of leading zeros and before the mask generation circuitry produces one or more masks. A normalised floating point number has a significand greater than or equal to 1 and less than 2.

Particular embodiments will now be described with reference to the figures.

Floating-point (FP) is a useful way of approximating real numbers using a small number of bits. The IEEE 754-2008 FP standard proposes multiple different formats for FP numbers, these include binary 64 (also known as double precision, or DP), binary 32 (also known as single precision, or SP), and binary 16 (also known as half precision, or HP). The numbers 64, 32, and 16 refer to the number of bits required for each format.

FP numbers are quite similar to the "scientific notation" taught in science classes, where instead of negative two million we'd write −2.0×106. The parts of this number are the sign (in this case negative), the significand (2.0), the base of the exponent (10), and the exponent (6). All of these parts have analogs in FP numbers, although there are differences, the most important of which is that the constituent parts are stored as binary numbers, and the base of the exponent is always 2.

More precisely, FP numbers consist of a sign bit, some number of biased exponent bits, and some number of fraction bits. In particular, the formats we are interested in consist of the following bits:

| format   | sign | exponent       | fraction      | exponent bias |
|----------|------|----------------|---------------|---------------|
| DP [63:0]| 63   | 62:52 (11 bits)| 51:0 (52 bits)| 1023          |
| SP [31:0]| 31   | 30:23 (8 bits) | 22:0 (23 bits)| 127           |
| HP [15:0]| 15   | 14:10 (5 bits) | 9:0 (10 bits) | 15            |

The sign is 1 for negative numbers and 0 for positive numbers. Typically, every number, including zero, has a sign.

The exponent is biased, which means that the true exponent differs from the one stored in the number. For example, biased SP exponents are 8-bits long and range from 0 to 255. Exponents 0 and 255 are special cases, but all other exponents have bias 127, meaning that the true exponent is 127 less than the biased exponent. The smallest biased exponent is 1, which corresponds to a true exponent of −126. The maximum biased exponent is 254, which corresponds to a true exponent of 127. HP and DP exponents work the same way, with the biases indicated in the table above.

SP exponent 255 (or DP exponent 2047, or HP exponent 31) is reserved for infinities and special symbols called NaNs (not a number). Infinities (which can be positive or negative) have a zero fraction. Any number with exponent 255 and a nonzero fraction is a NaN. Infinity provides a saturation value, so it actually means something like "this computation resulted in a number that is bigger than what we can represent in this format." NaNs are returned for operations that are not mathematically defined on the real numbers, for example division by zero or taking the square root of a negative number.

Exponent zero, in any of the formats, is reserved for subnormal numbers and zeros. A normal number represents the value:

$$-1^{sign} \times 1.\text{fraction} \times 2^e$$

where e is the true exponent computed from the biased exponent. The term 1.fraction is called the significand, and the 1 is not stored as part of the FP number, but is instead inferred from the exponent. Exponents except zero and the maximum exponent indicate a significand of the form 1.fraction. The exponent zero indicates a significand of the form 0.fraction, and a true exponent that is equal to 1-bias for the given format. Such a number is called subnormal (historically these numbers were referred to as denormal, but modern usage prefers the term subnormal).

Numbers with both exponent and fraction equal to zero are zeros.

The following table has some example numbers in HP format. The entries are in binary, with '_' characters added to increase readability. Notice that the subnormal entry (4th line of the table, with zero exponent) produces a different significand than the normal entry in the preceding line.

| sign | 5-bit exponent | 10-bit fraction | 11-bit significand | value            |
|------|----------------|-----------------|--------------------|------------------|
| 0    | 01111          | 00_0000_0000    | 100_0000_0000      | $1.0 \times 2^0$ |
| 1    | 01110          | 10_0000_0000    | 110_0000_0000      | $-1.1 \times 2^{-1}$ |
| 0    | 00001          | 10_0000_0000    | 110_0000_0000      | $1.1 \times 2^{-14}$ |

-continued

| sign | 5-bit exponent | 10-bit fraction | 11-bit significand | value |
|---|---|---|---|---|
| 0 | 00000 | 10_0000_0000 | 010_0000_0000 | $0.1 \times 2^{-14}$ |
| 1 | 11111 | 00_0000_0000 | | −infinity |
| 0 | 11111 | 00_1111_0011 | | NaN |

A large part of the complexity of FP implementation is due to subnormals, therefore they are often handled by microcode or software. Subnormals can be handled in hardware, speeding up these operations by a factor of 10 to 100 compared to a software or microcode implementation.

The FP way of handling signs is called sign-magnitude, and it is different from the usual way integers are stored in the computer (two's complement). In sign-magnitude representation, the positive and negative versions of the same number differ only in the sign bit. A 4-bit sign-magnitude integer, consisting of a sign bit and 3 significand bits, would represent plus and minus one as:

+1=0001 −1=1001

In two's complement representation, an n-bit integer i is represented by the low order n bits of the binary n+1-bit value $2^n+i$, so a 4-bit two's complement integer would represent plus and minus one as:

+1=0001 −1=1111

The two's complement format is practically universal for signed integers because it simplifies computer arithmetic.

A fixed-point number looks exactly like an integer, but actually represents a value that has a certain number of fractional bits. Sensor data is often in fixed-point format, and there is a great deal of fixed-point software that was written before the widespread adoption of FP. Fixed-point numbers are quite tedious to work with because a programmer has to keep track of the "binary point", i.e. the separator between the integer and fractional parts of the number, and also has to constantly shift the number to keep the bits in the correct place. FP numbers don't have this difficulty, so it is desirable to be able to convert between fixed-point numbers and FP numbers. Being able to do conversions also means that we can still use fixed-point software and data, but we are not limited to fixed-point when writing new software.

Most FP operations are required by the IEEE-754 standard to be computed as if the operation were done with unbounded range and precision, and then rounded to fit into an FP number. If the computation exactly matches an FP number, then that value is always returned, but usually the computation results in a value that lies between two consecutive floating-point numbers. Rounding is the process of picking which of the two consecutive numbers should be returned.

There are a number of ways of rounding, called rounding modes; six examples of these are:

| mode | definition | |
|---|---|---|
| RNE | round-to nearest, ties to even | pick the closest value, or if both values are equally close then pick the even value |
| RNA | round to nearest, ties to away | pick the closest value, or if both values are equally close then pick the value farthest away from zero |
| RZ | round to zero | pick the value closest to zero |
| RP | round to plus infinity | pick the value closest to plus infinity |
| RM | round to minus infinity | pick the value closest to minus infinity |
| RX | round to odd | pick the odd value |

The definition doesn't tell us how to round in any practical way. One common implementation is to do the operation, look at the truncated value (i.e. the value that fits into the FP format) as well as all of the remaining bits, and then adjust the truncated value if certain conditions hold. These computations are all based on:

L—(least) the least significant bit of the truncated value

G—(guard) the next most significant bit (i.e. the first bit not included in the truncation)

S—(sticky) the logical OR of all remaining bits that are not part of the truncation Given these three values and the truncated value, we can always compute the correctly rounded value according to the following table:

| mode | change to the truncated value |
|---|---|
| RNE | increment if (L&G) | (G&S) |
| RNA | increment if G |
| RZ | none |
| RP | increment if positive & (G|S) |
| RM | increment if negative & (G|S) |
| RX | set L if G|S |

For example, consider multiplying two 4-bit significands, and then rounding to a 4-bit significand.

sig1=1011 (decimal 11)
sig2=0111 (decimal 7)
multiplying yields:

sig1×sig2=1001_101 (decimal 77)

The four least significant bits (1101) correspond with the bits LGss in that order.

The least significant bit of the truncated 4-bit result is labelled L, the next bit G, and S is the logical OR of the remaining bits labelled s (i.e. S=0|1=1). To round, we adjust our 4-bit result (1001) according to the rounding mode and the computation in the table above. So for instance in RNA rounding, G is set so we return 1001+1=1010. For RX rounding G|S is true so we set L to 1 (it's already 1, so in this case nothing changes) and return 1001.

FIG. 1 illustrates a data processing apparatus 100 in accordance with one embodiment. In this example, the data processing apparatus receives two significand operands (siga and sigb), each of 106 bits. In this example, the value assigned to "siga" is the larger of siga and sigb. However, in an alternative embodiment the data processing apparatus 100 can be replicated in order to calculate both siga-sigb and sigb-siga. Each operand is 106 bits, because this is the size of a fused significand, which is used during the calculation of a fuse-multiply-add (FMA) operation. It will be appreciated that other significand sizes could also be used. The two values are passed to adder circuitry 110. Although the intention is to determine the difference between the values of siga and sigb, this can be accomplished by converting sigb to twos complement format, and adding siga, sigb, and 1. This is achieved by using adder circuitry 110 and by setting a carry flag of the adder circuitry 110 to '1' to achieve the addition of the '1'. The values siga and sigb are also passed to intermediate value generation circuitry 130, which forms part of a leading zero anticipator 120, which estimates the number of leading zeros in the difference between the value of siga and the value of sigb. The intermediate value generation circuitry 130 produces an intermediate value (w). The intermediate value, w, is such that it has a number of leading zeros that is equal to or one away from the number of leading zeros in the difference calculated by the adder circuitry 110. The intermediate value generation circuitry is thereby able to predict the number of leading zeros in the difference. The intermediate value w is analysed by count circuitry 140, which counts the number of leading zeros in w. The result (lshift) is a 7-bit number that provides an estimate to shifting circuitry 160 as to how many left shifts should be performed such that the difference calculated by the adder circuitry 110 will be normalised.

Separately, the intermediate value (w) produced by the intermediate value generation circuitry 130 is provided to mask generation circuitry 150 in order to generate one or more bitmasks. The operation of the mask generation circuitry 150 will be shown in more detail later. However, one or more of these masks are passed to overflow and rounding circuitry 170, which uses one or more of the masks produced by the mask generation circuitry 150 to determine whether or not a significand overflow has occurred. A significand overflow occurs when the significand increases in size due to a bit being carried during the calculation performed by the adder circuitry 110. If this occurs, then a right bit-shifter 180 is used to shift the significand one bit to the right in order to compensate. The result of this operation (either 0 or 1 shift to the right) is a normalised difference between siga and sigb. In the circuitry of FIG. 1, the mask generation circuitry 150 produces the masks from the intermediate value (w) and hence produces the masks at the same time or before the count circuitry 140 completes the counting operation. In this way, it is possible for the overflow and rounding circuitry 170 to more quickly determine whether or not there has been a significand overflow.

Figure 2:
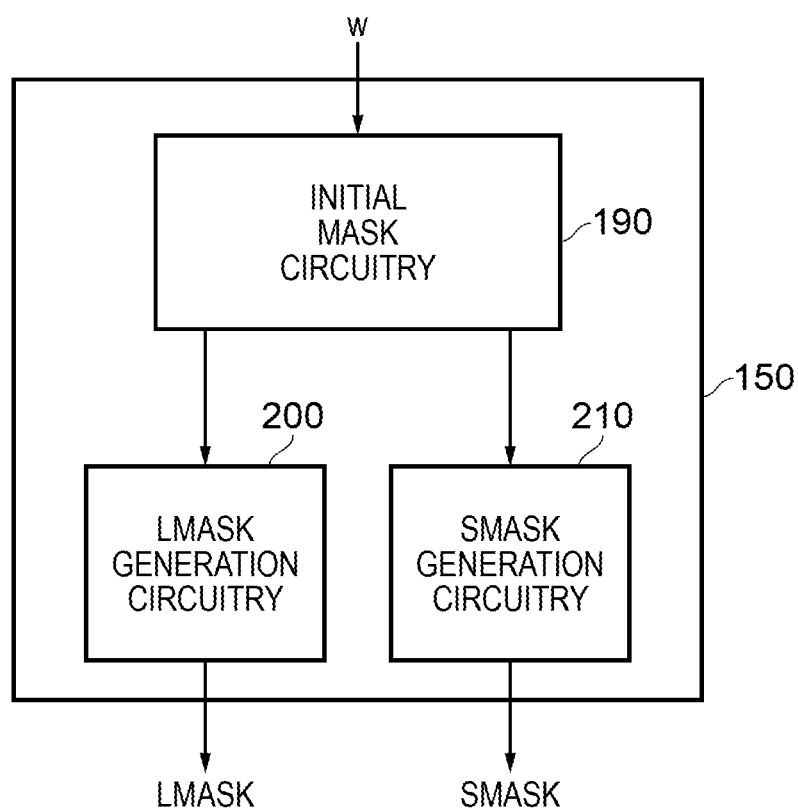
FIG. 2 illustrates an example mask generator in accordance with one embodiment.

FIG. 2 illustrates an example of the mask generation circuitry 150 in accordance with one embodiment. The mask generation circuitry 150 comprises initial mask circuitry 190, which receives the intermediate value (w) from the intermediate value generation circuitry 130 and performs an initial set of calculations on the intermediate value. These initial calculations are then passed to lmask generation circuitry 200 to calculate an lmask and smask generation circuitry 210 to calculate an smask. The lmask contains the same number of leading zeros as the intermediate value (w) followed by a 1. The remaining bits are all zero. The smask also contains the same number of leading zeros as the intermediate value (w) followed by a 1. The remaining bits are all one. So, for example, given an intermediate value (w) of 000110100100, the lmask would be 000100000000 and the smask would be 000111111111. These masks can be used to either determine whether a significand overflow has occurred, or to extract a particular bit from the difference calculation, as desired.

Figure 3:
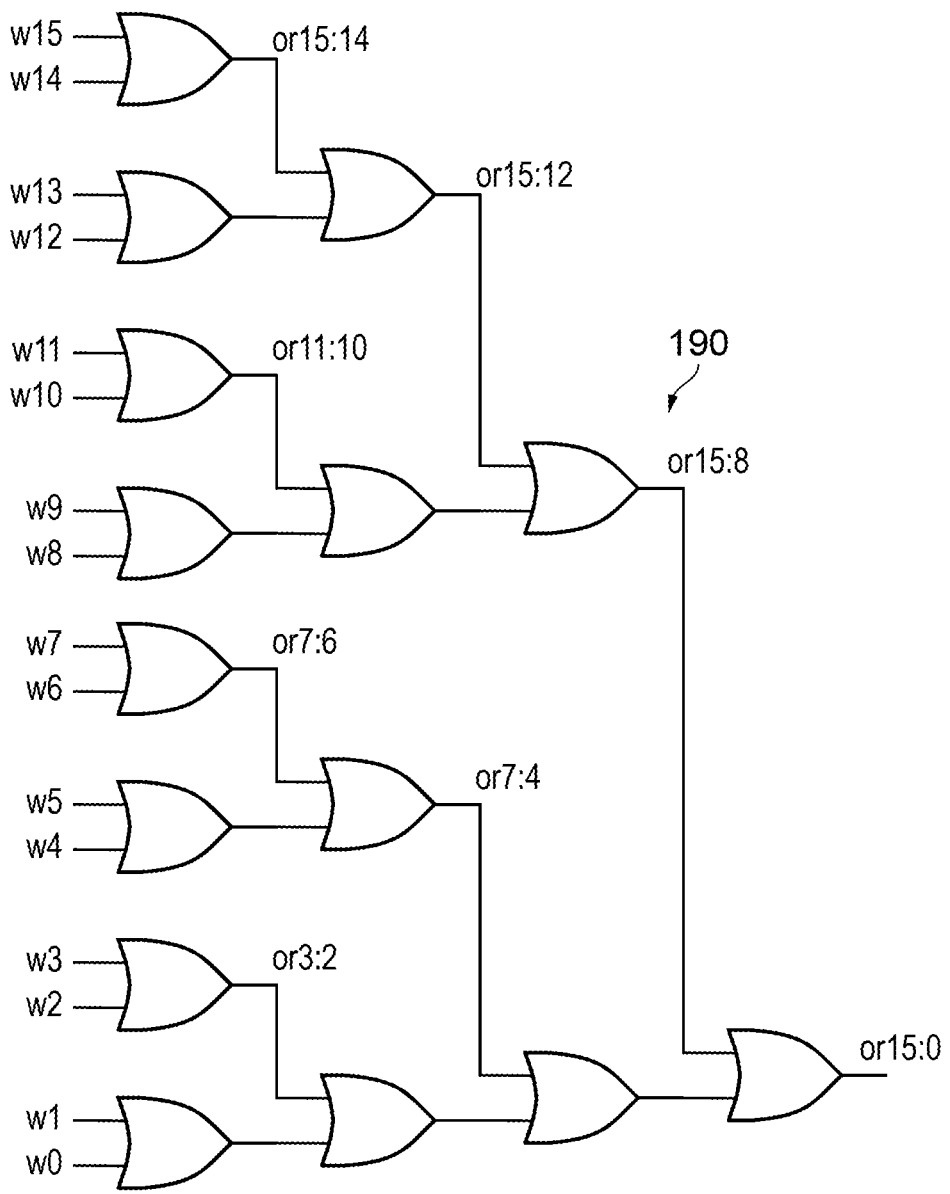
FIG. 3 illustrates an example initial mask generation circuitry in accordance with one embodiment.

FIG. 3 illustrates an example of initial mask circuitry 190, suitable for a 16-bit number. The skilled person will appreciate that the structure can be generalised to produce an initial set of calculations. The initial calculations represent a logical OR of different subsets of contiguous bits of w. As the skilled person will appreciate, a logical OR of a subset of bits will be '1' if any one of those bits is '1'. Each pair of neighbouring bits (e.g. w0 and w1, w2 and w3, w3 and w4, etc.) are inserted as inputs to an OR gate. Outputs from an OR gate at one level are provided as inputs to an OR gate at the next level. In this way, the number of OR gate halves at each level, until at the top level, there is one OR gate that indicates whether any of the bits in the input are a '1' or not. Additionally, the first input to each OR gate (other than those at the first level) are provided as initial calculations to the lmask generation circuitry 200 and the smask generation circuitry 210. In the example of FIG. 3, the initial calculations include the values or(15:0), or(15:8), or(15:12), or (7:4), or(15:14), or(11:10), or(7:6), or(3:2). Using this information, the most significant '1' for an arbitrary value of '1' can be located quickly. These internal values are used in FIG. 4 to allow us to quickly find the most significant '1' in w (the intermediate value).

Figure 4:
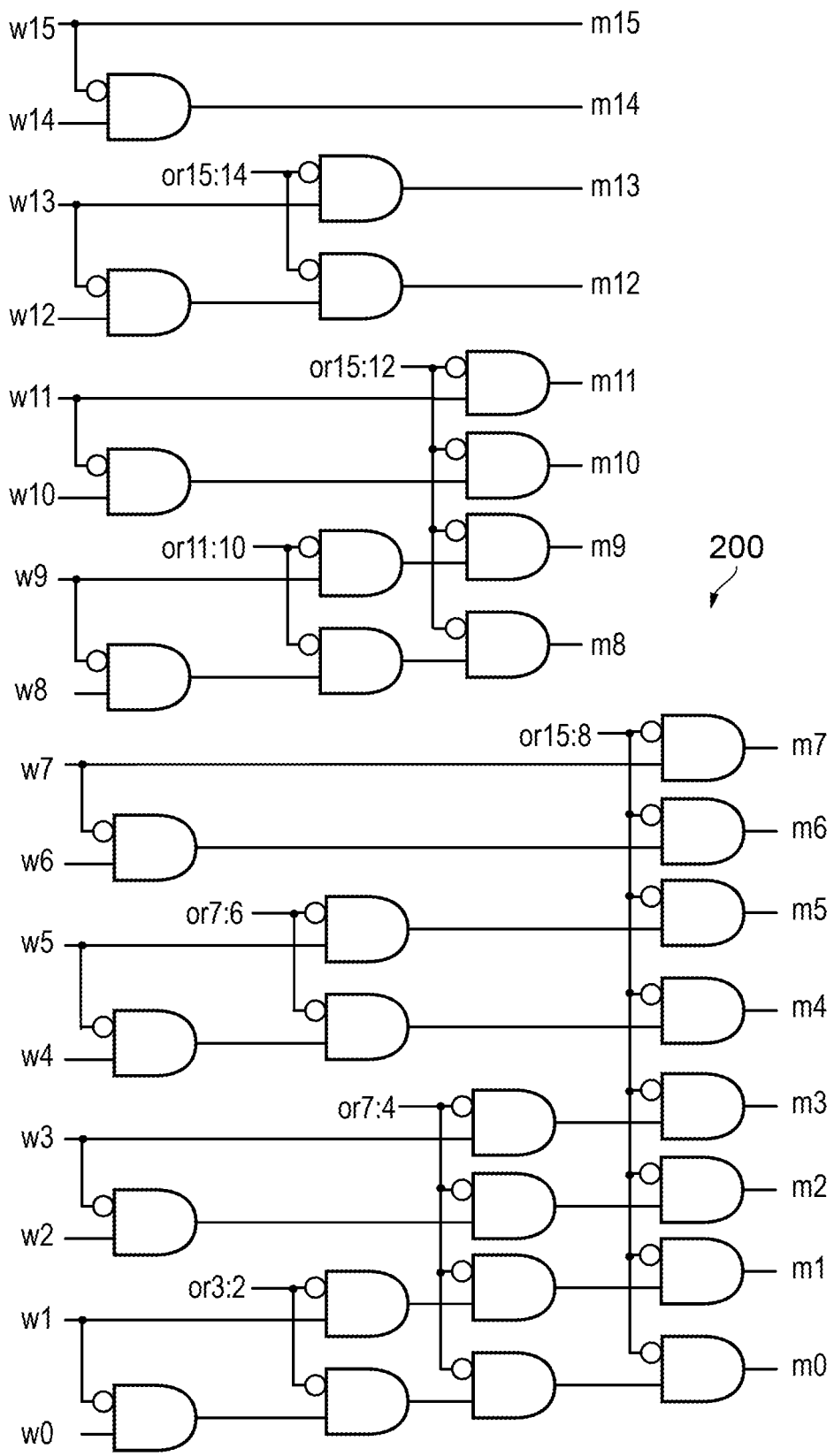
FIG. 4 schematically illustrates an example of lmask generation circuitry in accordance with one embodiment.

FIG. 4 illustrates lmask generation circuitry 200, which is made up from a number of AND gates, with each of the AND gate inverting one of the two inputs. The lmask generation circuitry uses the initial calculations produced by the initial mask circuitry 190 to produce a series of output bits (m0 . . . m15), which represent the bits of the lmask. At a first level, each group comprises a pair of bits (e.g. w0 and w1, w2 and w3, w3 and w4, etc.), the more significant bit proceeds through, while the less significant bit is received as an input to an AND gate, together with an inverted form of an OR of the more significant bit (i.e. the more significant bit itself at the first level). In other words, within each group, the less significant half will only be a '1' if the more significant half is not a '1'. In the case of a first level, for example, w14 could only be '1' if w15 is not '1'. This results in a pair of outputs for each group, the first indicating if the top half of the group is a '1', the second indicating if the bottom half of the group is a '1'. At each subsequent level, adjacent groups are combined. Therefore, at the second level, the first group relates to the first 4 bits (w0-w3). Again the top half of the bits proceed through automatically, while the less significant half are received as an input to an AND gate, together with an inverted form of an OR of the more significant bits. Again, in other words, within each group, the less significant half will only be a '1' if the more significant half is not a '1'. Hence, in the case of the second level, w3 and w2 proceed through. Conversely, w0 and w1 are each ANDed with or(3:2). This results in four outputs.

The number of outputs is the same at each level. Similarly, at each level, the number of AND gates is equal to b/2, where b is the number of bits of w.

Figure 5:
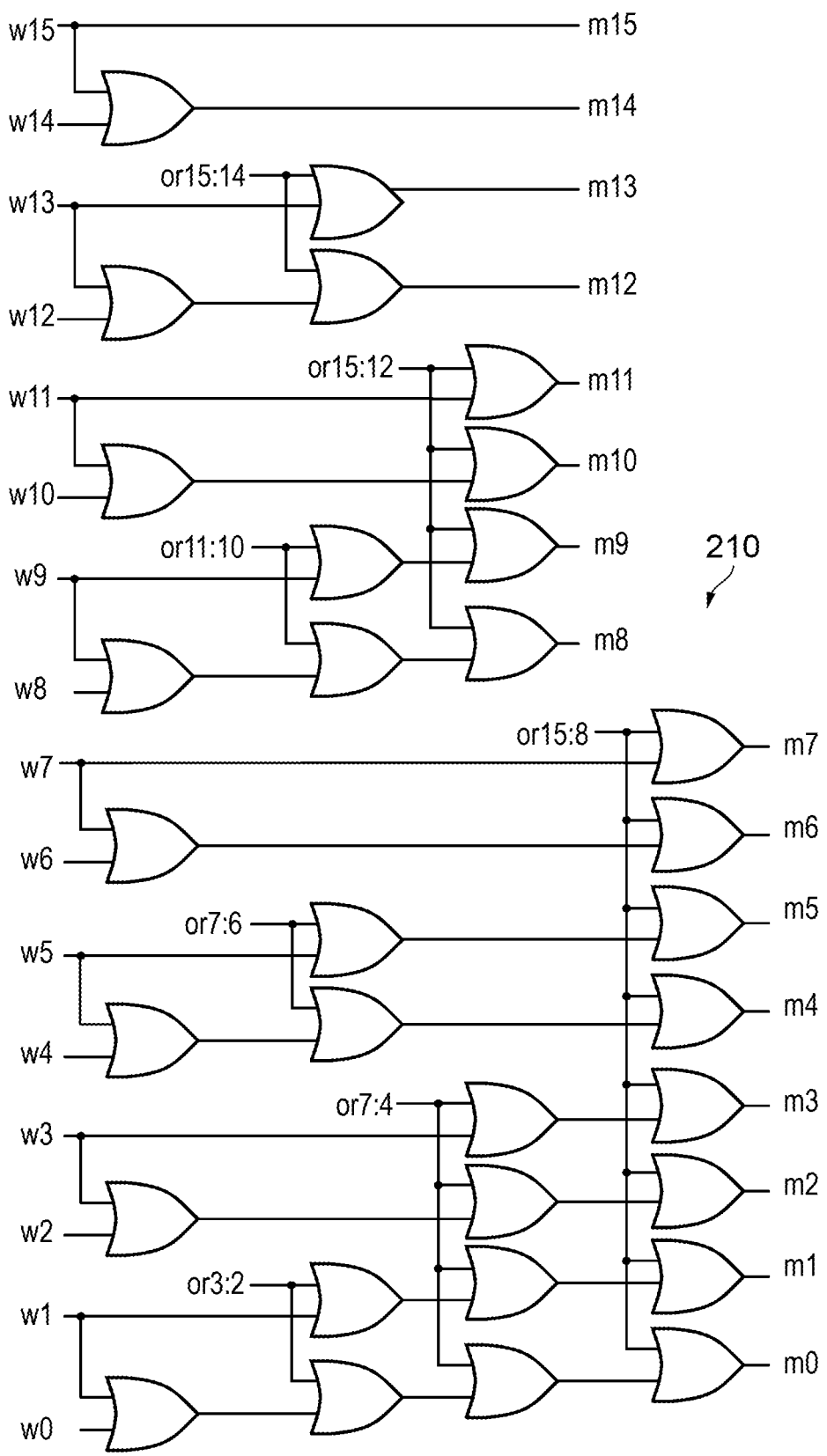
FIG. 5 schematically illustrates an example of smask generation circuitry in accordance with one embodiment.

FIG. 5 illustrates smask circuitry 210. The smask circuitry corresponds with the lmask circuitry shown in FIG. 4, except that the partially-inverting AND gates are replaced by OR gates.

Figure 6:
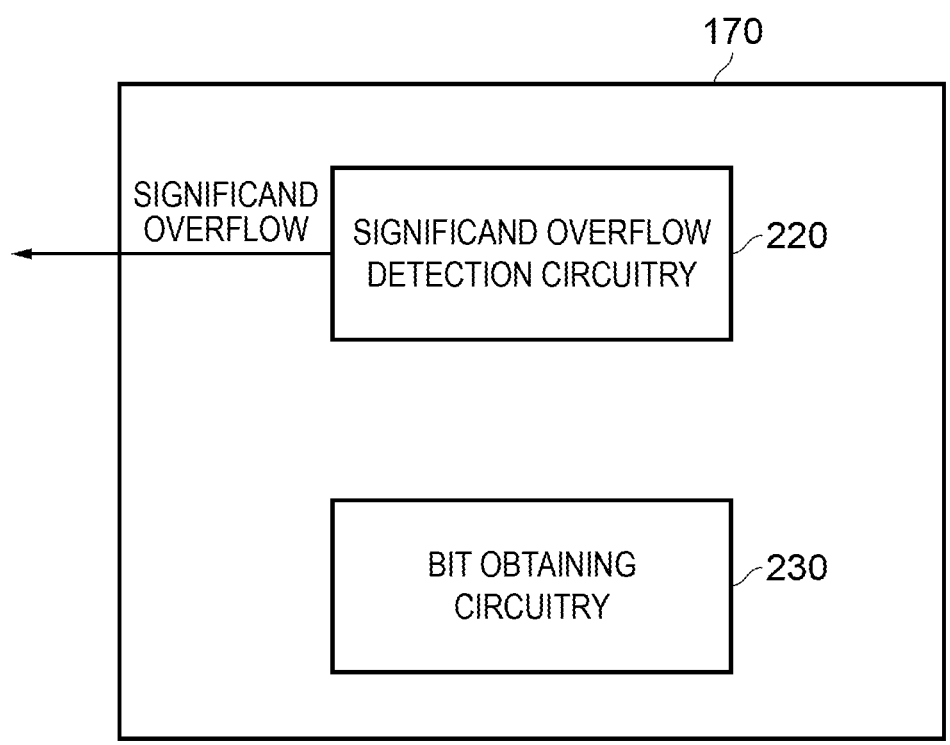
FIG. 6 schematically illustrates circuitry for using masks to detect significand overflow and obtaining particular bits of the difference.

FIG. 6 schematically illustrates overflow and rounding circuitry 170, which uses the lmask and smask to detect significand overflow and obtain particular bits of the difference calculated by the adder circuitry 110. The overflow and rounding circuitry 170 receives one or more masks produced by the mask generation circuitry 150.

The lmask is used by significand overflow detection circuitry 220 in order to detect a significand overflow. This can be achieved by moving the lmask one bit to the left, performing a bitwise AND operation between the shifted lmask and the difference, and then performing a reduction OR on the result. In practice, however, it is not necessary to actually perform a shift operation and instead, the appropriate bits can be directly wired so that the desired bits can be operated on. In particular, the significand overflow signal can be calculated by the expression |(lmask[105:0] & diff [106:1].

The overflow and rounding circuitry 170 also includes bit obtaining circuitry 230 to obtain a particular bit from the difference calculated by the adder circuitry 110. For example, the requested bit could be an overflow least significant bit, a least significant bit, an overflow guard bit, and a guard bit. The overflow variants of the least significant bit and the guard bit correspond with the least significant bit and guard bit if the significand has overflowed (hence, the position of the overflow guard bit is the same as the least significant bit). Accordingly, the overflow least significant bit can be detected by moving the lmask 52 bits to the right, the overflow guard bit (or least significant bit) can be detected by moving the lmask 53 bits to the right, and the guard bit can be detected by moving the lmask 54 bits to the right. In each case, the shifted lmask is then bitwise ANDed with the difference, and a reduction OR is performed. The number of shifts is dependent on the nature of siga and sigb. In this example, it is assumed that both values are double precision and therefore the significand is 53 bits in length. Again, in practice, it is not necessary to actually shift the lmask. Instead, the appropriate bits can be directly wired in order to operate the relevant bits. The overflow least significant bit can therefore be determined, in this example, by the expression |(lmask[106:51] & diff[55:0]), the least significant bit or overflow guard bit can be determined by the expression |(lmask[106:52] & diff[54:0]), meanwhile, the guard bit can be determined by the expression |(lmask[106:53] & sum[53:0]). The bitwise AND is therefore performed between the top t bits of the lmask and bottom t bits of diff.

The smask can also be used by the bit obtaining circuitry 230 in order to obtain the overflow sticky bit and the normal sticky bit. The sticky bit is produced as a consequence of performing an OR on all bits following the guard bit. Therefore, it is necessary to use the smask in order to obtain trailing bits from the cliff. In the above example of a double precision floating point number, the sticky bits can only be in the lower 54 bits of the difference. Accordingly, calculating the overflow sticky bit is achieved by the expression |(smask[53:0] & diff[53:0]) and the sticky bit is achieved by the expression |(smask[52:0] & diff[52:0]).

Figure 7:
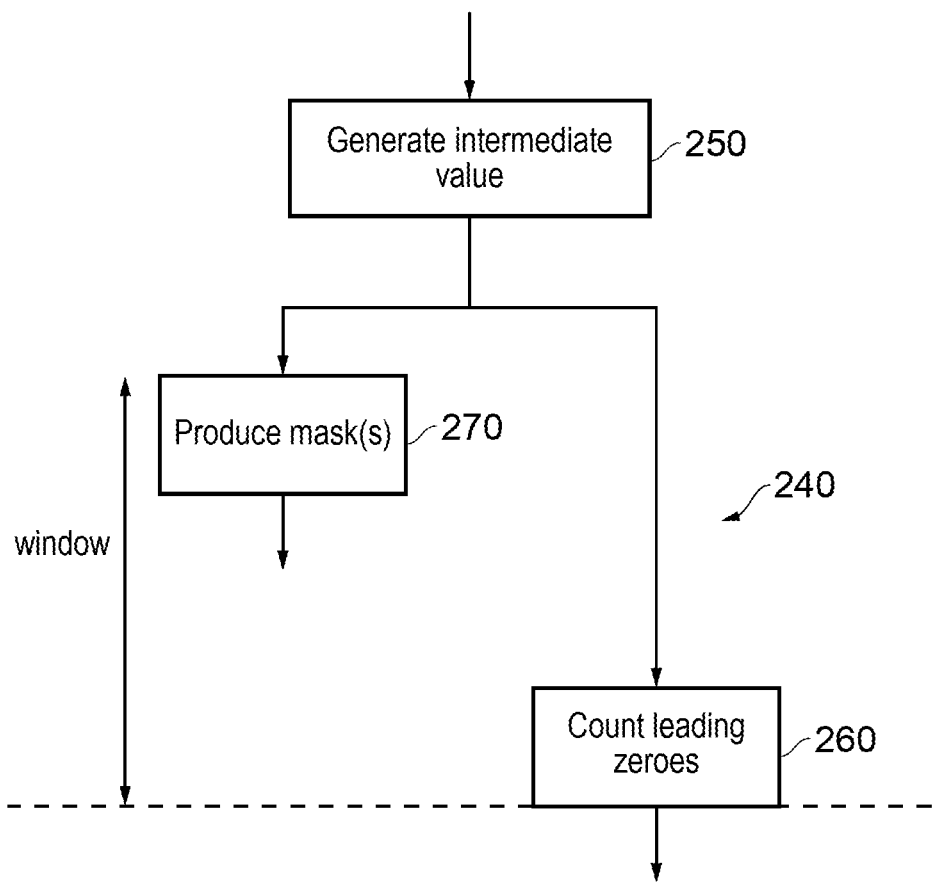
FIG. 7 contains a flow chart showing an example data processing method in accordance with one embodiment.

FIG. 7 illustrates a flowchart 240 showing an example data processing method in accordance with one embodiment. The process starts at step 250, where an intermediate value (w) is generated. The process then splits into two parts. At a step 260, the number of leading zeros in the intermediate value (w) is calculated. This can be achieved by count circuitry 140. During a window of time that ends when step 260 completes, one or more masks are produced at step 270, e.g. by mask generation circuitry 150.

Figure 8:
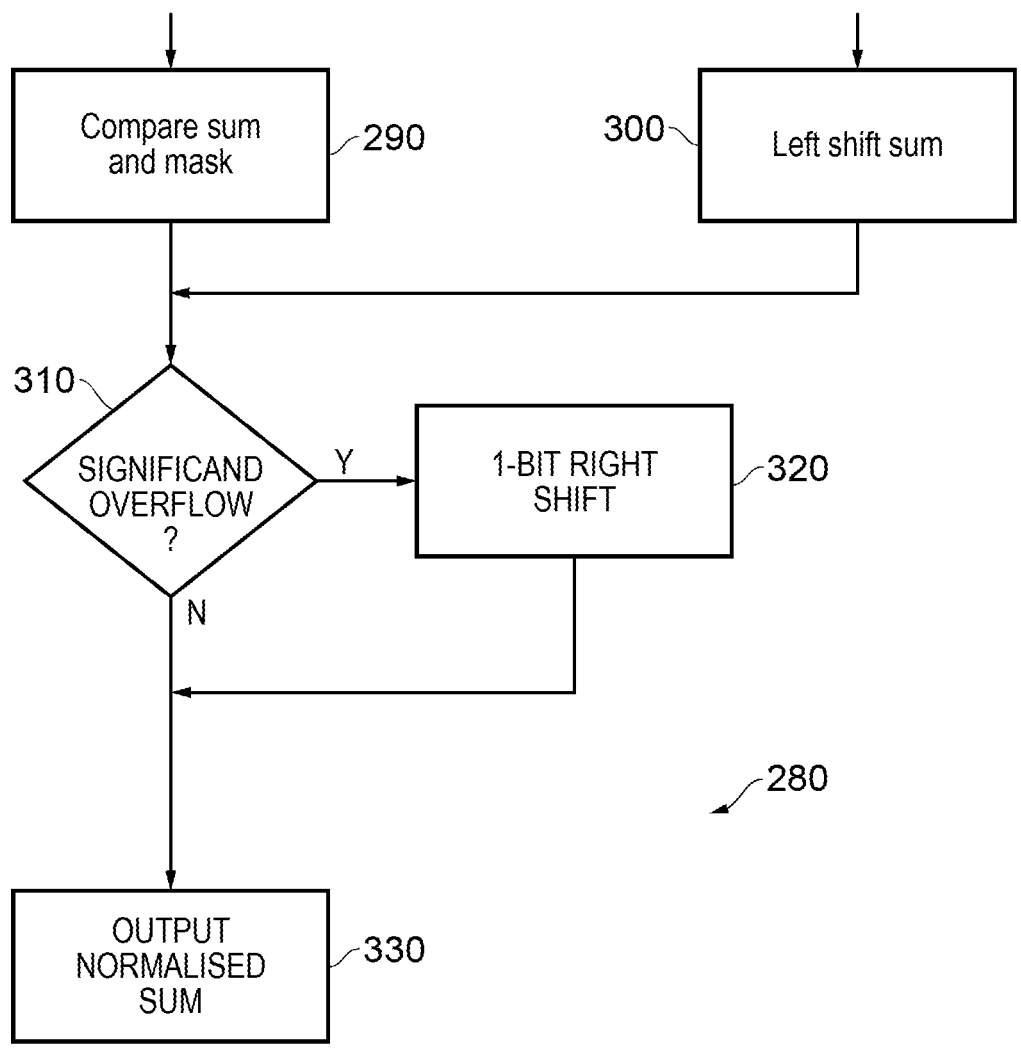
FIG. 8 contains a flow chart showing an example of using the generated masks in accordance with one embodiment.

FIG. 8 contains a flow chart 280 showing an example of using the generated masks in accordance with one embodiment. At step 290 the sum (or difference) between the two floating point significands is compared with the generated mask. This can be achieved by significand overflow detection circuitry 220. Approximately simultaneously, the sum (or difference) is left shifted a number of times indicated by the count circuitry 140. This may be achieved by a left shifter 160. In either case, at step 310, it is determined from the significand overflow detection circuitry 220 whether or not a significand overflow has occurred. If so, then at step 320, a 1-bit right shift is performed on the sum/diff (e.g. by right shifter 180). In either case, at step 330, the normalised sum/diff is output.

In a similar way, the bit obtaining circuitry 230 can be used to determine the value of particular bits, regardless of whether a significand overflow has occurred or not. These values could be output in order to perform a rounding operation on the normalised sum, in dependence on those values and the rounding operation being performed.

The above embodiment is therefore able to produce masks for determining significand overflow and for obtaining particular bits of a difference/sum operation more quickly, by using an intermediate value (w) that approximates the number of leading zeros in the difference/sum. In this way, it is possible to normalise the output (and round the output) more quickly than if we used no masks or used masks generated from the leading zero count of the intermediate value (w). This can be particularly useful in "near path" operations, where the exponents of the inputs are the same or are off by one, and can therefore result in numbers with many leading zeros.

Consider a first worked example, in which siga=1001_1010 and sigb=1000_1100. The operation siga−sigb is the same as performing siga+~sigb+1 (this is twos complement subtraction. The result of this operation is 0000_1110 (disregarding any integer overflow). The difference therefore has four leading zeros. The intermediate value will have the same (or one more) leading zeros as the difference. Exactly how w is calculated is beyond the scope of this document and has been discussed elsewhere at length. In this case, the intermediate value is 0000_1001 . In other words, four leading zeros are predicted. The lmask would be 0000_1000 and the smask would be 0000_1111. The result of |(lmask[7:0] & diff[8:1]) is 0. Therefore, no overflow has occurred. This can be confirmed by noting that adding the top four bits during the add operation results in 0000, while no carry out occurs during the bottom four bits.

Consider a second worked example, in which siga=1001_1010 and sigb=0110_1111. The result of the operation is 0000_1010. The intermediate value in this case is 0000_0101. The lmask is therefore 0000_0100 and the smask is 0000_0111. Five leading zeros are therefore predicted. However, the result of |(lmask[7:0] & diff[8:1]) is 1. Therefore a significand overflow has occurred. This can be confirmed by noting that if we add the top five bits during the add operation, the result is 00000. Meanwhile, in the bottom three bits, there is a carry out. The prediction by w is therefore off by 1 and so the correct number of leading zeros is 4. In the circuitry of FIG. 1, this would result in the left shifter 160 performing 5 left shifts based on w. The detection of the significand overflow would then result in a further one-bit right shift by right shifter 180 in order to perform a correction for the misprediction.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

I claim:

1. A data processing apparatus comprising:
   intermediate value generation circuitry to generate an intermediate value from a first floating point number and a second floating point number, wherein said intermediate value comprises a number of leading 0s indicative of a prediction of a number of leading 0s in a difference between absolute values of said first floating point number and said second floating point number, said prediction differing by at most one from said number of leading 0s in said difference between absolute values of said first floating point number and said second floating point number;

count circuitry to count said number of leading 0s in said intermediate value;

mask generation circuitry to produce one or more masks using said intermediate value; and difference circuitry to determine said difference between said absolute values of said first floating point number and said second floating point number, wherein said mask generation circuitry is configured to produce said one or more masks at a same time or before said count circuitry counts said number of leading 0s in said intermediate value;

said intermediate value comprises a plurality of leading zeros, followed by a most significant 1, followed by zero or more 0s and 1s;

a position of said most significant 1 is either:
- a same as a position of a most significant 1 in said difference of said absolute values of said first floating point number and said second floating point number, or
- adjacent said position of said most significant 1 in said difference of said absolute values of said first floating point number and said second floating point number;

said one or more masks comprises an lmask to indicate said position of said most significant 1 in said intermediate value; and said mask generation circuitry produces said lmask by taking said intermediate value and replacing said zero or more 0s and 1s with an equal number of 0s.

2. A data processing apparatus according to claim 1, comprising:
significand overflow detection circuitry to detect, based on said lmask and said difference, whether a significand of said difference has overflowed.

3. A data processing apparatus according to claim 2, wherein
said significand overflow detection circuitry is configured to detect whether said significand of said difference has overflowed by performing a logical AND operation between said lmask and bits other than a low-order bit of said difference.

4. A data processing apparatus according to claim 2, wherein
said significand overflow detection circuitry is configured to detect whether said significand of said difference has overflowed by performing a logical pairwise AND operation between said lmask shifted left once and bits other than a low-order bit of said difference.

5. A data processing apparatus according to claim 2, wherein
in response to said significand overflow detection circuitry detecting that said significand of said difference has overflowed, to perform a one bit corrective right shift on said difference.

6. A data processing apparatus according to claim 1, comprising:
bit obtaining circuitry to return, based on said lmask, a value of a given bit of said difference.

7. A data processing apparatus according to claim 6, wherein
said given bit is one of: an overflow least significant bit, a least significant bit, an overflow guard bit, and a guard bit.

8. A data processing apparatus according to claim 6, wherein
said bit obtaining circuitry returns said value of said given bit of said difference by performing a logical AND operation on a subset of bits of said difference and a subset of bits of said lmask; and
said subset of bits of said difference and said subset of bits of said lmask are dependent on said given bit.

9. A data processing apparatus according to claim 6, wherein
said bit obtaining circuitry returns said value of said given bit of said difference by performing a logical AND on said difference and said lmask shifted right a number of times; and
said number of times is dependent on said given bit.

10. A data processing apparatus according to claim 1, wherein
said one or more masks comprises an smask to indicate a position of a bit other than leading 0s in said difference; and
said mask generation circuitry produces said smask by taking said intermediate value and replacing said zero or more 0s and 1s with an equal number of 1s.

11. A data processing apparatus according to claim 10, comprising:
bit obtaining circuitry to return, based on said smask, zero or more trailing bits of said difference.

12. A data processing apparatus according to claim 11, wherein
said bit obtaining circuitry returns said zero or more trailing bits of said difference by performing a logical AND operation on a subset of bits of said difference and a subset of bits of said smask.

13. A data processing apparatus according to claim 12, wherein
said trailing bits comprise an overflow sticky bit;
said subset of bits of said difference is a trailing x bits of said difference and said subset of bits of said smask is a trailing x bits of said smask; and
x is equal to a number of sticky bits in said difference plus one.

14. A data processing apparatus according to claim 12, wherein
said trailing bit comprises a sticky bit;
said subset of bits of said difference is a trailing y bits of said difference and said subset of bits of said smask is a trailing y bits of said smask; and
y is equal to a number of sticky bits in said difference.

15. A data processing apparatus according to claim 1, wherein
said first floating point number and said second floating point number are normalised.

16. A data processing method comprising:
generating, by intermediate value generation circuitry, an intermediate value from a first floating point number and a second floating point number, wherein said intermediate value comprises a number of leading 0s indicative of a prediction of a number of leading 0s in a difference between absolute values of said first floating point number and said second floating point number, said prediction differing by at most one from said number of leading 0s in said difference between absolute values of said first floating point number and said second floating point number;

counting, by count circuitry, said number of leading 0s in said intermediate value;

producing, by mask generation circuitry, one or more masks using said intermediate value; and determining said difference between said absolute values of said first floating point number and said second floating point number, wherein said step of producing one or more masks occurs at a same time or before said step of counting said number of leading 0s in said intermediate value said intermediate value comprises a plurality of leading zeros, followed by a most significant 1, followed by zero or more 0s and 1s;

a position of said most significant 1 is either:
- a same as a position of a most significant 1 in said difference of said absolute values of said first floating point number and said second floating point number, or
- adjacent said position of said most significant 1 in said difference of said absolute values of said first floating point number and said second floating point number;

said one or more masks comprises an lmask to indicate said position of said most significant 1 in said intermediate value; and said lmask is produced by taking said intermediate value and replacing said zero or more 0s and 1s with an equal number of 0s.

* * * * *